United States Patent [19]

Matsumoto et al.

[11] Patent Number: 5,031,149
[45] Date of Patent: Jul. 9, 1991

[54] NON-VOLATILE SEMICONDUCTOR MEMORY DEVICE HAVING, AT THE PRESTAGE OF AN ADDRESS DECODER, A LEVEL SHIFTER FOR GENERATING A PROGRAM VOLTAGE

[75] Inventors: Osamu Matsumoto, Yokohama; Yuji Nakano; Isao Abe, both of Kawasaki; Mika Saeki, Inagi, all of Japan

[73] Assignee: Kabushiki Kaisha Toshiba, Kawasaki, Japan

[21] Appl. No.: 425,947

[22] Filed: Oct. 24, 1989

[30] Foreign Application Priority Data

Nov. 21, 1988 [JP] Japan ............................ 63-294185

[51] Int. Cl.$^5$ ...................... G11C 7/00; G11C 16/00; G11C 16/04; H03K 3/01
[52] U.S. Cl. ........................... 365/189.11; 365/104; 365/185; 365/226; 307/296.1
[58] Field of Search .............. 365/230.06, 226, 189.09, 365/51, 104, 189.11; 307/296.1, 296.5, 297

[56] References Cited

U.S. PATENT DOCUMENTS 4,737,936 4/1988 Takeuchi ............................ 365/185

OTHER PUBLICATIONS

Rinerson, D. et al., 512K EPROMS; ISSCC Dig. Tech. Papers, pp. 136–137, Feb. 1984.

Primary Examiner—Alyssa H. Bowler
Attorney, Agent, or Firm—Finnegan, Henderson, Farabow, Garrett and Dunner

[57] ABSTRACT

A non-volatile semiconductor device includes word lines, and a non-volatile memory cell array having a plurality of non-volatile memory cells respectively connected to the word lines. The non-volatile semiconductor memory device further includes a level shifter for receiving, in a programming mode, an address signal supplied from outside, and shifting the potential level of the address signal to a higher programming potential level, and a row decoder, provided between the word lines and the level shifter, for receiving and decoding the address signal which has been shifted by the level shifter, and selecting one of the word lines in accordance with the result of the decoding of the address signal, and setting the potential of the selected word line to the programming potential level.

7 Claims, 4 Drawing Sheets

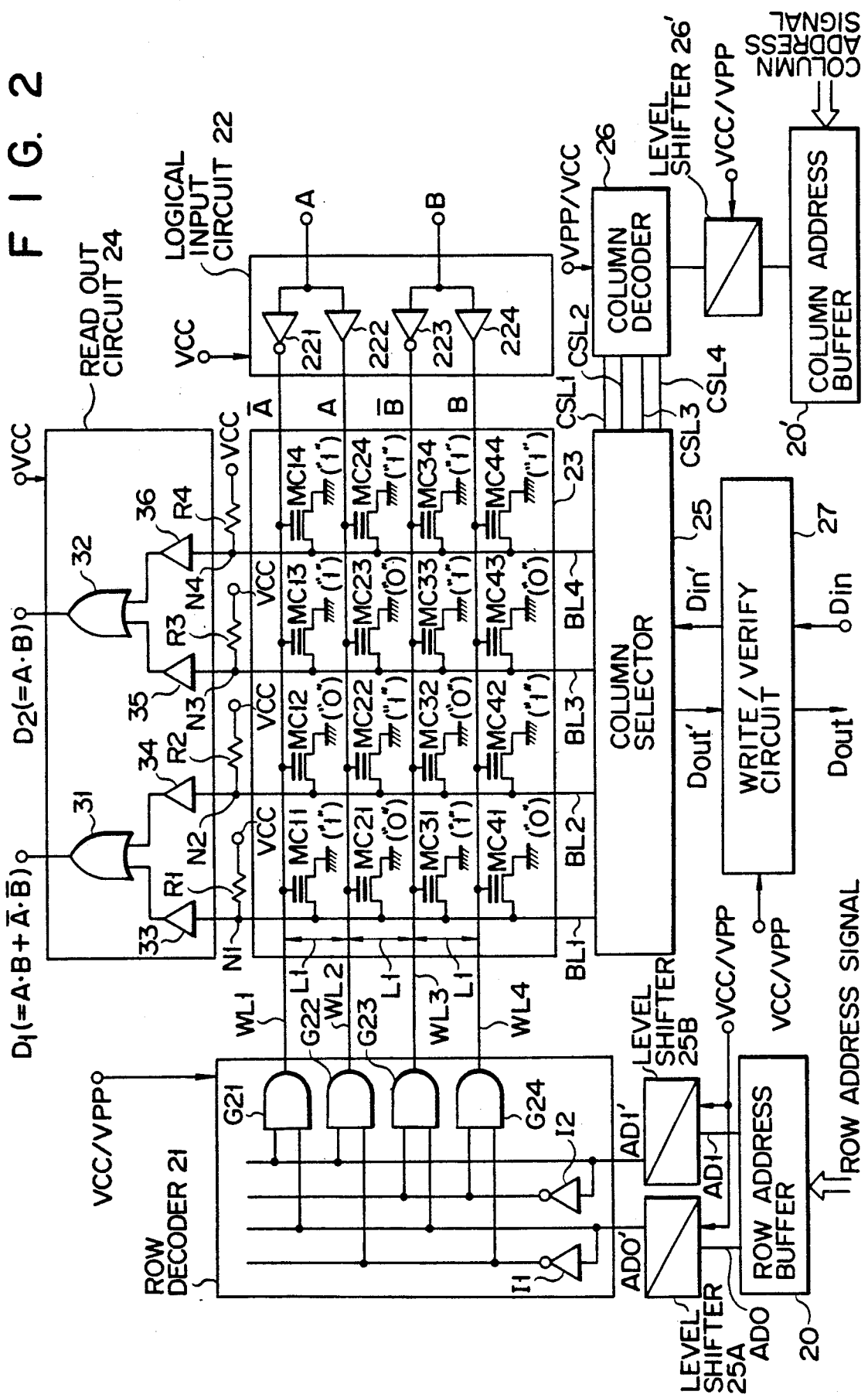
F I G. 2

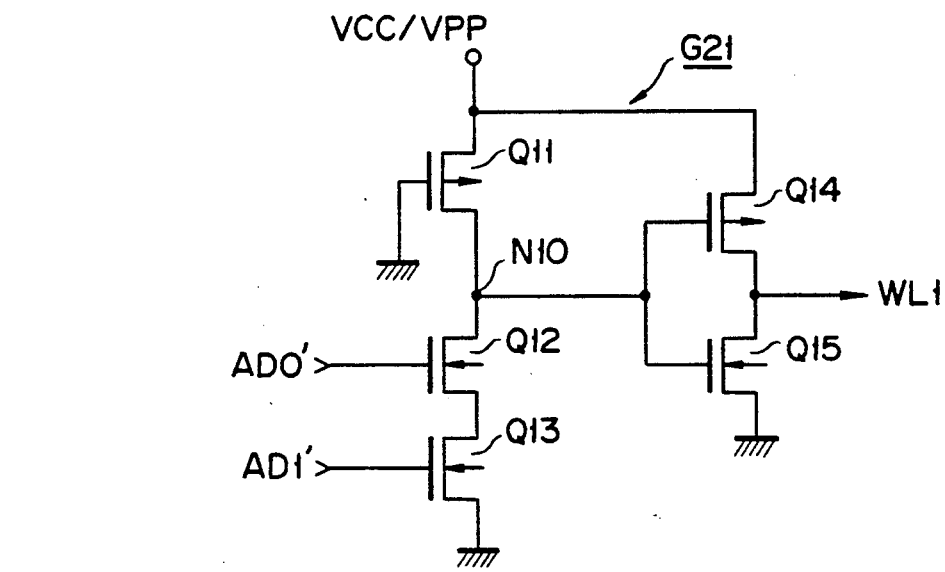
F I G. 3
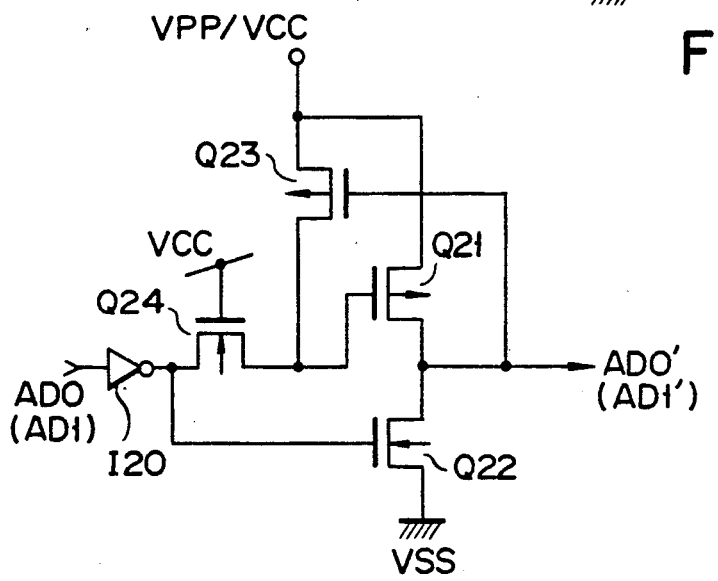
F I G. 4
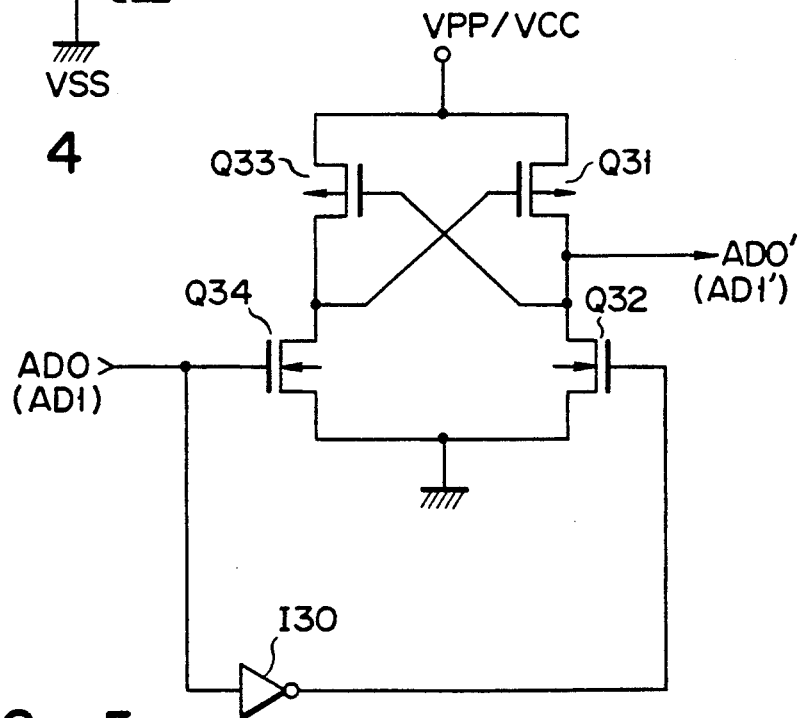
F I G. 5

5,031,149

NON-VOLATILE SEMICONDUCTOR MEMORY DEVICE HAVING, AT THE PRESTAGE OF AN ADDRESS DECODER, A LEVEL SHIFTER FOR GENERATING A PROGRAM VOLTAGE

BACKGROUND OF THE INVENTION

1. Field of the Invention

The present invention relates to a non-volatile semiconductor memory device, and in particular, to a non-volatile semiconductor memory device having, at the prestage of an address decoder, a level shifter for generating a program voltage.

2. Description of the Related Art

Generally, in a non-volatile semiconductor memory device such as an EPROM (Erasable Programmable ROM) or an EEPROM (Electrically Erasable Programmable ROM), a floating gate type transistor is employed as a memory cell transistor. In order to write data in such a memory cell transistor, it is necessary to supply the memory cell transistor with a write-in voltage, which is higher than the readout voltage for reading the data of the memory cell transistor. For example, in a data read mode, a read-out voltage of 5 V is supplied to a control gate of the memory cell transistor. In a programming mode, a write-in voltage of 12.5 V is supplied to the control gate of the memory cell transistor.

In a conventional memory device, as shown in FIG. 1, in order to supply the voltage of 5 V and the voltage of 12.5 V, selectively, to the memory cell transistor in accordance with the operation mode, level shift circuits 15 are provided between a row decoder 11 and a non-volatile memory cell array 13. The level shift circuits 15 are connected to word lines WL1 to WL4 which are connected to the control gates of memory cell transistors MC1 to MC4 in the cell array 13.

A power source voltage Vcc of 5 V is supplied from outside to each level shift circuit 15 in the data read mode, while a power source voltage Vpp of 12.5 V is supplied from outside to each level shift circuit 15 in the programming mode. Consequently, when the word line WL1, for example, is selected by row decoder 11 which decodes row address signals AD0 and AD1, the level shift circuit 15 sets the potential of the word line WL1 to 5 V in the data readout mode, and to 12.5 V in the programming mode. Thus, the control gate of memory cell transistor MC1 is supplied with the voltage of 5 V in the data readout mode and with the voltage of 12.5 V in the programming mode.

When the memory device of FIG. 1 is integrated on a single chip, the distance L1 between adjacent word lines WL1 to WL4 is determined, depending on the size of each of the memory cell transistors MC1 to MC4, the size of each of the AND gates G1 to G4 in row decoder 11, and the size of each of the elements constituting the level shift circuits 15.

In general, the size of each element used in the level shift circuits 15 is greater than that of each of the AND gates G1 to G4 of row decoder 11 and that of each of memory cell transistors MC1 to MC4. Thus, the distance L1 between word lines is determined by the size of each element constituting the level shift circuits 15.

As a result, the distance L1 in the non-volatile memory device becomes greater, compared to a dynamic RAM or the like, which does not require the provision of level shift circuits 15. Normally, a large number of word lines are provided in a non-volatile memory device, therefore the increase in the distance L1 between word lines would prevent high integration of the non-volatile memory device.

Furthermore, when a circuit pattern is laid out in the non-volatile memory device, as shown in FIG. 1, a space for installation of level shift circuits 15 must be provided between the row decoder 11 and the memory cell array 13. This limitation to the layout of the circuit pattern is also a factor preventing high integration of the non-volatile memory device.

SUMMARY OF THE INVENTION

The object of the present invention is to provide a non-volatile memory device having a structure suitable for high integration.

The present invention provides a non-volatile semiconductor device comprising a plurality of word lines; a non-volatile memory cell array having a plurality of non-volatile memory cells connected to the word lines, respectively; level shift means for receiving, in a programming mode, an address signal supplied from outside, and shifting the potential level of the address signal to a higher programming potential level; and row decoding means, provided between the word lines and the level shift means and driven by a programming power source voltage having said programming potential level in the programming mode, for receiving and decoding the address signal, the potential level of which is shifted by the level shift means, selecting one of the word lines in accordance with the result of the decoding of the address signal, and setting the potential of the selected word line to the programming potential level.

According to the non-volatile semiconductor memory device of the present invention, only the non-volatile memory cells and the row decoding means are connected directly to the word lines, and the level shift means is not connected directly to the word lines. Thus, the distance between adjacent word lines is not influenced by the level shift means. The distance between adjacent word lines is determined only by the non-volatile memory cells and the decoding means.

In this non-volatile semiconductor memory device, it is thus possible to reduce the distance between adjacent word lines, as in a dynamic RAM which does not require the level shift means. Therefore, the degree of integration of the non-volatile semiconductor memory device can be increased.

BRIEF DESCRIPTION OF THE DRAWINGS

FIG. 2 is a block diagram showing a structure of a PLD (Programmable Logic Device) as a non-volatile memory device according to an embodiment of the present invention;

FIG. 3 is a circuit diagram showing an example of a specific structure of that portion of a row decoder which corresponds to one row, the row decoder being provided in the PLD shown in FIG. 2;

FIG. 4 is a circuit diagram showing an example of a specific structure of a level shift circuit provided in the PLD shown in FIG. 2;

FIG. 5 is a circuit diagram showing another example of a specific structure of the level shift circuit provided in the PLD shown in FIG. 2.

DETAILED DESCRIPTION OF THE PREFERRED EMBODIMENTS

Figure 1:
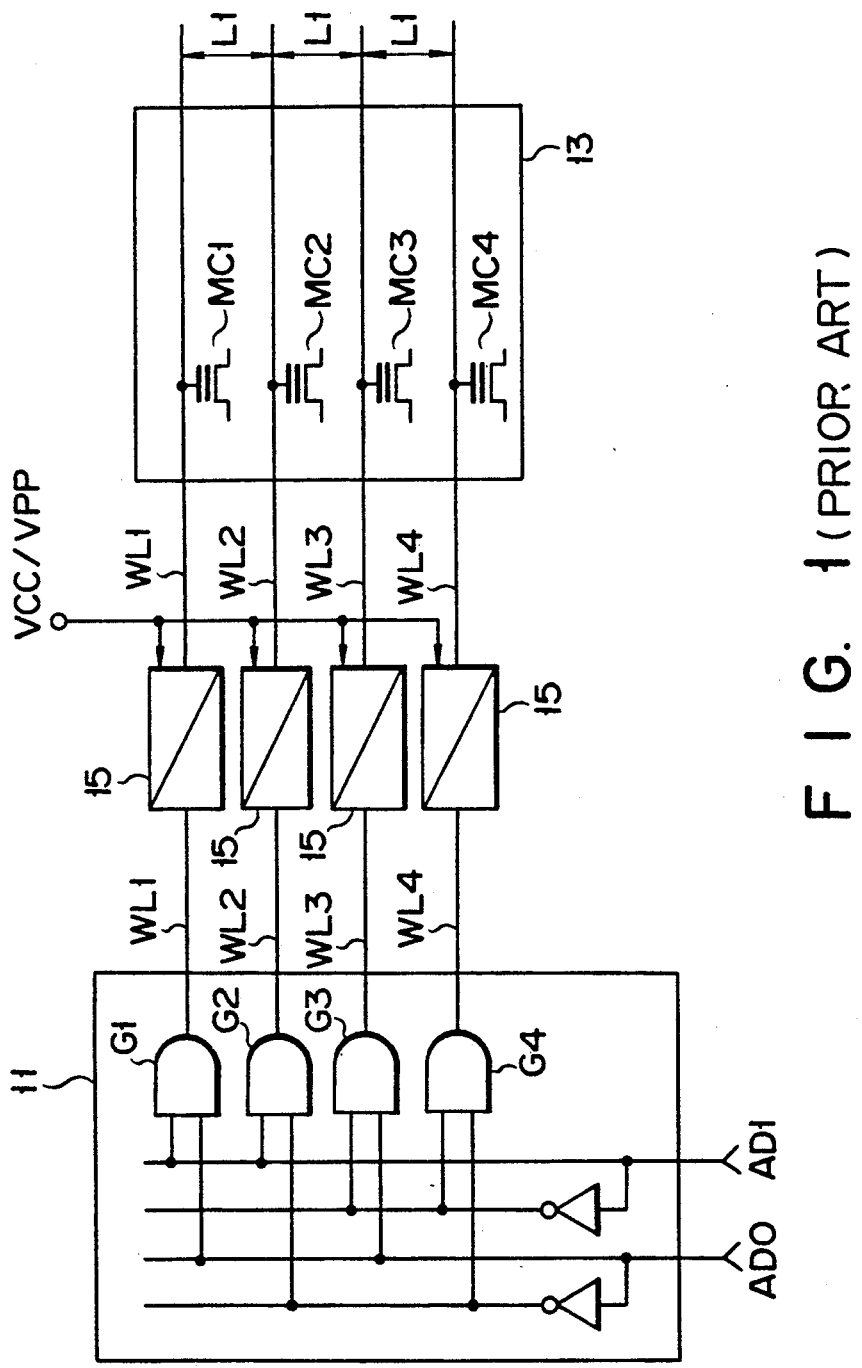
FIG. 1 is a block diagram showing a conventional non-volatile memory device.

FIG. 2 shows a PLD (Programmable Logic Device) as a non-volatile semiconductor memory device according to an embodiment of the present invention. The PLD is integrated on a single chip, and is composed so that it can program logical data by using non-volatile memory cell transistors.

In the PLD, a non-volatile memory cell array 23 has non-volatile memory cell transistors MC11 to MC44. These transistors MC11 to MC44 are floating gate type MOS transistors. The transistors MC11 to MC44 are arranged at intersections of word lines WL1 to WL4 and bit lines BL1 to BL4. Each of non-volatile memory cell transistors MC11 to MC44 has a control gate connected to a corresponding one of the word lines, a drain connected to a corresponding one of the bit lines, a source connected to a ground terminal, and a floating gate for storing data.

A row address buffer 20 receives and waveform-shapes a row address signal supplied from outside, and produces address signals AD0 and AD1 each having an amplitude of, e.g., 5 V.

Level shifters 25A and 25B are connected to a power supply terminal from which a power source voltage Vcc of 5 V and a power source voltage Vpp of 12.5 V are selectively supplied. The power source voltage Vcc of 5 V is supplied to the level shifters 25A and 25B in the data read mode, and the power source voltage Vpp of 12.5 V is supplied to the level shifters 25A and 25B in the programming mode. In the programming mode, the level shifters 25A and 25B receive the address signals AD0 and AD1 from the row address buffer 20, and raise the amplitude levels of the address signals AD0 and AD1 up to 12.5 V, thus outputting address signals AD0' and AD1' each having an amplitude of 12.5 V. For example, when the level shifter 25A receives the address signal AD0 having a binary "1" level or 5 V, it produces the address signal AD0' having a binary "1" level of 12.5 V. When the level shifter 25A receives the address signal AD0 having a binary "0" level of 0 V, it produces the address signal AD0' having a binary "0" level of 0 V.

On the other hand, in the data read mode, the level shifters 25A and 25B do not shift the amplitude levels of the address signals AD0 and AD1 received from the row address buffer 20, and produce the address signals AD0' and AD1' having an amplitude level of 5 V with no changes.

Like the level shifters 25A and 25B, the row decoder 21 is connected to a power supply terminal from which a power source voltage Vcc of 5 V and a power source voltage Vpp of 12.5 V are selectively supplied. In the data read mode, the power source voltage Vcc of 5 V is supplied to the row decoder 21. In the programming mode, the power source voltage Vcc of 12.5 V is supplied to the row decoder 21. In the programming mode, the row decoder 21 decodes the address signals AD0' and AD1', each having an amplitude of 12.5 V, and selects one of the word lines WL1 to WL4 in accordance with the result of the decoding. The potential of the selected word line is set to 12.5 V. On the other hand, in the data read mode, the row decoder 21 decodes the address signals AD0' and AD1' each having the amplitude of 5 V, and selects one of the word lines WL1 to WL4 in accordance with the result of the decoding. In this case, the potential of the selected word line is set to 5 V.

The row decoder 21 has 2-input AND gates G21 to G24 and inverters I1 and I2, as shown in FIG. 2. In the row decoder 21, the address signal AD0' is supplied to one input terminal of each of 2-input AND gates G21 and G23 directly, and also to one input terminal of each of 2-input AND gates G22 and G24 through inverter I1. The address signal AD1' is supplied to the other input terminal of 2-input AND gates G21 and G22 directly, and also to the other input terminal of each of 2-input AND gates G23 and G24 through inverter I2. Output terminals of 2-input AND gates G21 to G24 are connected to the word lines WL1 to WL4, respectively. In the data read mode, the AND gates G21 to G24 are supplied with the power source voltage Vcc of 5 V as a driving voltage. In the programming mode, the AND gates G21 to G24 are supplied with the power source voltage Vpp of 12.5 V as a driving voltage. Also, the inverter I1 is supplied with the power source voltage Vcc of 5 V as a driving voltage in the data read mode and with the power source voltage Vpp of 12.5 V as the driving voltage in the programming mode.

A column decoder 26 is supplied with a column address input signal from a column address buffer 20' through a level shifter 26'. In the data read mode or the programming mode, the column decoder 26 receives and decodes the column address signal, and selects one of column select lines CSL1 to CSL4 in accordance with the result of the decoding. The potential of the selected column select line is set to 5 V in the data read mode, and is set to 12.5 V in the programming mode. The column decoder 26 and the level shifter 26' are supplied with the power source voltage Vpp of 12.5 V in the programming mode and with the power source voltage Vcc of 5 V in the readout mode.

The column selector 25 selects the bit line BL1 when the column select line CSL1 is selected. Similarly, the column selector 25 selects the bit lines BL2 to BL4 when the column select lines CSL2 to CSL4 are respectively selected. A write/verify circuit 27 is supplied with the power source voltage Vpp in the programming mode and with the power source voltage Vcc in the data read mode.

The write/verify circuit 27 receives, in the programming mode, write-in data Din having an amplitude of 5 V, from outside, and converts the write-in data Din to write-in data Din' having an amplitude of 12.5 V, then outputs write-in data Din' to one of the bit lines BL1 to BL4 selected by column selector 25. In the data read mode, the write/verify circuit 27 reads out cell data appearing on one of bit lines BL1 to LB4 selected by column selector 25, and outputs the cell data as readout data Dout.

A logical input circuit 22 is connected to a power source terminal from which a power source voltage Vcc of 5 V is supplied. The logical input circuit 22 functions only in a logical operation mode, and does not function in the above-mentioned programming mode or the data read mode. In the logical operation mode, the logical input circuit 22 receives logical input signals A and B, supplied from the outside, and outputs them along with inverted signals $\overline{A}$ and $\overline{B}$, inverted from signals A and B, to the word lines WL1 to WL4, respectively. These logical input signals A, B and inverted signals $\overline{A}$, and $\overline{B}$ have amplitudes of 5 V.

The logical input circuit 22 comprises inverters 221 and 223, and buffers 222 and 224. In the logical input circuit 22, the logical input signal A is inverted by the inverter 221, and the inverted signal $\overline{A}$ is supplied to the word line WL1, while the logical input signal A is supplied to the word line WL2 through the buffer 222. Similarly, the logical input signal B is inverted by the inverter 223, and the inverted signal $\overline{B}$ is supplied to the word line WL3, while the logical input signal B is supplied to the word line WL4 through the buffer 224.

A readout circuit 24 is connected to source terminal Vcc, from which a power source voltage of 5 V is supplied. In the logical operation mode, the readout circuit 24 outputs logical output signals D1 and D2, representative of the contents of a program in the cell array 23. The readout circuit 24 comprises OR gates 31 and 32 and buffers 33 to 36. Input nodes of the buffers 33 and 34 are connected to the bit lines BL1 and BL2 respectively, and output nodes of the buffers 33 and 34 are respectively connected to first and second input nodes of the 2-input OR gate 31. Input nodes of buffers 35 and 36 are connected to the bit lines BL3 and BL4 respectively, and output nodes of the buffers 35 and 36 are connected to first and second input nodes of the 2-input OR gate 32, respectively. An output from the OR gate 31 is delivered to the outside as the logical output signal D1, and an output from the OR gate 32 is delivered to the outside as the logical output signal D2.

The bit lines BL1 to BL4 are connected to first ends of resistors R1 to R4. Second ends of the resistors R1 to R4 are connected to power supply terminals from which power source voltages Vcc of 5 V are supplied.

The operation of the PLD having the above structure will now be described.

In the programming mode the row address signals AD0' and AD1' having an amplitude of 12.5 V are output from the level shifters 25A and 25B. Based on the row address signals AD0' and AD1', the row decoder 21 selects one of the word lines WL1 to WL4, and sets the potential of the selected word line to 12.5 V. For example, in the case where the row address signal AD0' has a binary "1" level and the row address signal AD1' has a binary "0" level, binary "1" signals are supplied to the two input terminals of the 2-input AND gate 23. Thus, the word line WL3 is selected, and the potential thereof is set to 12.5 V.

On the other hand, one of the bit lines BL1 to BL4, which has been selected by the column selector 25, is supplied with the write-in data Din having amplitude of 12.5 V from the write/verify circuit 27. For example, when the bit line BL2 has been selected, the potential of the bit line BL2 is set to 12.5 V or 0 V, depending on whether the write-in data Din' has the binary "1" level or the binary "0" level.

In this manner, when the word line WL3 and the bit line BL2, for example, are selected and the write-in data Din' has the binary "1" level, the potential of the control gate of memory cell transistor MC32 is set to 12.5 V by the selected word line WL3, and the potential of the drain of transistor MC32 is set to 12.5 V by the selected bit line BL2. Consequently hot electrons are injected in the floating gate of memory cell transistor MC32, and the threshold voltage of the memory cell transistor MC32 is raised. The state of transistor MC32 in which the threshold voltage is high corresponds to the data "0" storing state. On the other hand, a memory cell transistor in which hot electrons are not injected has a low threshold value; thus, the data stored in the memory cell transistor is "1". The memory cell transistor having the stored data "0" is not turned on even if the voltage of 5 V is applied to the control gate of the memory cell transistor. In contrast, the memory cell transistor having the stored data "1" is turned on when the voltage of 5 V is applied to the control gate thereof.

As described above, in the programming mode, data "1" or data "0" is written in each of memory cell transistors MC11 to MC44 of the memory cell array 23, thus programming the memory cell array 23.

In the operation mode, the logical input signals A and B, each having a binary "1" level or a binary "0" level, are supplied to the logical input circuit 22. Consequently, the logical input signals A and B, and their inverted signals $\overline{A}$ and $\overline{B}$, are applied to the word lines WL1 to WL4. In this case, suppose that the memory cell transistors MC11 to MC44 of memory cell array 23 are programmed, as shown in FIG. 2. Namely, the data stored in each of memory cell transistors MC11, MC31, MC22, MC42, MC13, MC33, MC14, MC24, MC34, and MC44 is "1", and the data stored in each of memory cell transistors MC21, MC41, MC12, MC32, MC23, and MC43 is "0". In this case, only the memory cell transistors storing data "1" are turned on by the control gate voltage of 5 V. Thus, the potential of node N1 of the bit line BL1 is $\overline{A}+\overline{B}=A \cdot B$, the potential of node N2 of the bit line BL2 is $A+B=\overline{A \cdot B}$, the potential of node N3 of the bit line BL3 is $\overline{A}+\overline{B}=A \cdot B$, and the potential of node N4 of the bit line BL4 is 0.

As a result, the OR gate 31 outputs the logical output signal D1 having the value $A \cdot B + \overline{A} \cdot \overline{B}$, and OR gate 32 outputs the logical output value D2 having the value $A \cdot B$.

In the data readout mode, the row address signals AD0' and AD1', each having an amplitude of 5 V, are output from the level shifters 25A and 25B. Based on the row address signals AD0' and AD1', the row decoder 21 selects one of the word lines WL1 to WL4 and sets the potential of the selected word line to 5 V. For example, when the row address signal AD0' has a binary "1" level and the row address signal AD1' has a binary "0" level, the input terminals of the AND gate G23 are supplied with "1" level signals. Thus, the word line WL3 is selected, and the potential thereof is set to 5 V.

In this case, since the data stored in each of memory cell transistors MC31, MC33 and MC34 is "1", and the data stored in memory cell transistor MC32 is "0", the potentials of nodes N1 to N4 are set to logical "038 level, logical "1" level, logical "0" level, and logical "0" level, respectively. As a result, one of the potentials of node N1 to N4 selected by column selector 25 is read out from the write/verify circuit 27.

As described above, in the PLD of this embodiment, the level shifters 25A and 25B are not directly connected to the word lines WL1 to WL4, and are provided at the front stage of the row decoder 21. Only the memory cell transistors MC11 to MC44 and the row decoder 21 are directly connected to the word lines WL1 to WL4. Thus, when the PLD is integrated on a single chip, the distance L1 between adjacent word lines WL1 to WL4 is determined only by the memory cell transistors MC11 to MC44 and the row decoder 21, irrespective of the level shifters 25A and 25B. In this PLD, the distance L1 can be reduced, for example, as in the case of dynamic RAM in which level shifters 25A and 25B are not required. Therefore, a PLD with high integration can be achieved.

If level shifters are provided at the rear stage of the row decoder 21, the number of level shifters must be the same as the number of the word lines. In contrast, in the case where level shifters are provided at the front stage of row decoder 21 as in this embodiment (see 25A and 25B), the required number of level shifters will be half that of the word lines. This is because row decoder 21 is constructed to select one of 2N word lines based on an N-bit address signal. Thus, the number of level shifters in this embodiment can be remarkably reduced, compared to the case where level shifters are provided at the rear stage of the row decoder 21.

FIG. 3 shows, as an example of a specific circuit structure of the row decoder 21, the structure of the AND gate G21 corresponding to word line WL1. The AND gate G21 comprises P-channel MOS transistors Q11 and Q14, and N-channel MOS transistors Q12, Q13 and Q15. The transistors Q11, Q12 and Q13 constitute a NAND gate, and the transistors Q14 and Q15 constitute a CMOS inverter. The transistors Q11, Q12 and Q13 are connected in series between a power supply terminal, from which a power source voltage Vcc of 5 V and a power source voltage Vpp of 12.5 V are selectively supplied, and a ground terminal. The gate of transistor Q11 is connected to a ground terminal. The gates of transistors Q12 and Q13 are supplied with row address signals AD0' and AD1' delivered from the level shifters 25A and 25B. The transistors Q14 and Q15 are connected in series between the power supply terminal, from which the power source voltage Vcc of 5 V and the power source voltage Vpp of 12.5 V are selectively supplied, and a ground terminal. The gates of transistors Q14 and Q15 are commonly connected to a series-connection node N1O of transistors Q11 and Q12. In this circuit, the channel length of each of transistors Q11 to Q15 is set to a relatively large value, in order to increase the withstand voltage thereof.

In the programming mode, the power source voltage of 12.5 V is supplied to the power supply terminal, and the amplitudes of row address signals AD0' and AD1' are set to 12.5 V. When both row address signals AD0' and AD1' are set to binary "1" level, i.e., 12.5 V, the transistors Q12 and Q13 are fully turned on, and the potential of the node N10 is decreased from 12.5 V to 0 V. As a result, the transistor Q14 is turned on and the transistor Q15 is turned off. Thus, the potential of word line WL1 is set to 12.5 V.

On the other hand, when one of the row address signals AD0' and AD1' has binary "0" level, the potential of the node N10 is not decreased, and this potential is kept at 12.5 V by the normally "on" transistor Q11. Thus, the transistor Q14 is turned off and the transistor Q15 is turned on, so that the potential of word line WL1 is set to 0 V.

FIG. 4 shows an example of a specific circuit structure of the level shifter 25A (25B) shown in FIG. 2. The level shifter shown in FIG. 4 comprises P-channel MOS transistors Q21 and Q23, N-channel MOS transistors Q22 and Q24, and a CMOS inverter I20. The transistors Q21 and Q22 are connected in series between a power supply terminal, from which a power source voltage Vcc of 5 V and a power source voltage Vpp of 12.5 V are selectively supplied, and a ground terminal. The gate of transistor Q21 is connected through a source-drain pass of transistor Q24 to the output terminal of the CMOS inverter I20. The gate of transistor Q24 is connected to a power supply terminal, from which a power source voltage Vcc of 5 V is supplied. The input terminal of CMOS inverter I20 is supplied with the address signal AD0 (or AD1) from the row address buffer 20. The gate of transistor Q22 is connected directly to the output terminal of CMOS inverter I20. The source of transistor Q23 is connected to the power supply terminal, from which the power source voltage Vcc of 5 V and the power source voltage Vpp of 12.5 V are selectively supplied, and its drain is connected to the gate of transistor Q21. The gate of transistor Q23 is connected to a connection node between the transistors Q21 and Q22. The channel length of each of transistors Q21 to Q24 in this circuit is set at a relatively high value, in order to raise the withstand voltage thereof.

In the programming mode (i.e., when the power source voltage of 12.5 V is supplied to the power supply terminal), the level shift circuit shown in FIG. 4 shifts the level of the row address signal AD0 to the row address signal AD0' having an amplitude of 12.5 V. The level shift operation will now be described.

When the row address signal AD0 representative of binary data "1" (i.e., 5 V) is supplied to the inverter I20, the gates of the P-channel MOS transistor Q21 and N-channel MOS transistor Q22 are supplied with signals of 0 V. Thus, the transistor Q21 is turned on and the transistor Q22 is turned off, and the row address signal AD0' of 12.5 V is output.

On the other hand, when the row address signal AD0 representative of binary data "0" (i.e., 0 V) is delivered to the inverter I20, a signal of 5 V is supplied to the gate of N-channel MOS transistor Q22. Thus, the transistor Q22 is turned on. Consequently, the potential of the row address signal AD0' becomes lower than 12.5 V, and the transistor Q23 is turned on. Upon the turning-on of transistor Q23, the gate potential of transistor Q21 is raised to 12.5 V, and the transistor Q21 is turned off. In this case, the transistor Q24 prevents the gate potential of transistor Q21 from flowing to the output terminal of CMOS inverter I20. In this manner, the transistor Q21 is turned off, and the transistor Q22 is turned on, thus outputting the row address signal AD0' of 0 V.

FIG. 5 shows another specific structure of the level shifter 25A (25B) shown in FIG. 2. This level shifter comprises P-channel MOS transistors Q31 and Q33, N-channel MOS transistors Q32 and Q34, and a CMOS inverter I30. The transistors Q31 and Q32 are connected in series between a power supply terminal, from which a power source voltage Vcc of 5 V and a power source voltage Vpp of 12.5 V are selectively supplied, and a ground terminal. Similarly, the transistors Q33 and Q34 are connected in series between the power supply terminal, from which the power source voltage Vcc of 5 V and the power source voltage Vpp of 12.5 V are selectively supplied, and the ground terminal. The gate of transistor Q31 is connected to a series-connection node of the transistors Q33 and Q34, and the gate of transistor Q33 is connected to a series-connection node of the transistors Q31 and Q32. The row address signal AD0 is supplied directly to the gate of transistor Q34, and is also supplied to the gate of transistor Q32 through the CMOS inverter I30. In this circuit, the channel length of each of transistors Q31 to Q34 is set to a relatively high value, in order to increase the withstand voltage thereof.

In the programming mode, when the row address signal AD0, representative of binary data "1" (i.e., 5 V), is supplied, the transistor Q34 is turned on and the transistor Q32 is turned off. Consequently, the transistor Q31 is turned on and the transistor Q33 is turned off. In this manner, the transistor Q31 is turned on and the transistor Q32 is turned off, thus outputting the row address signal AD0' of 12.5 V.

On the other hand, when the row address signal AD0, representative of binary data "0" (i.e., 0 V), is supplied, the transistor Q34 is turned off and the transistor Q32 is turned on. Consequently, the transistor Q33 is turned on and the transistor Q31 is turned off. In this manner, the transistor Q31 is turned off and the transistor Q32 is turned on, thus outputting the row address signal AD0' of 0 V.

Figure 6:
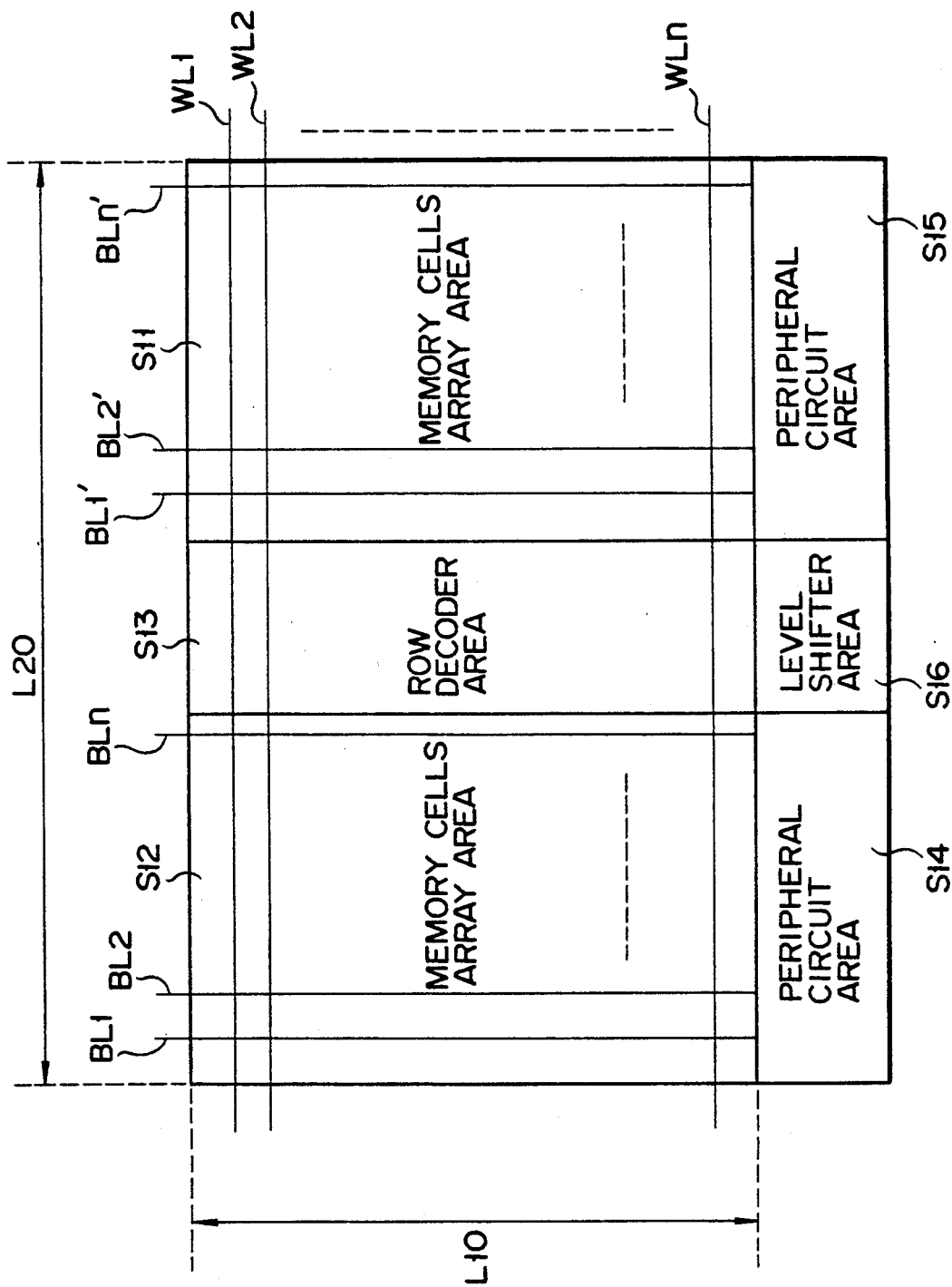
FIG. 6 is a block diagram schematically showing an example of a layout pattern on a chip of the PLD shown in FIG. 2.

FIG. 6 shows an example of a layout pattern of the PLD shown in FIG. 2 on a chip. Though FIG. 2 shows the memory cell array 23 having four rows and four columns, for the purpose of convenience, actually, a memory cell array having a large memory capacity is used. In FIG. 6, the memory cell array is divided into two memory cell array areas S11 and S12. The areas S11 and S12 are provided with common word lines WL1 to WLn. A row decoder area S13 is provided between the memory cell array areas S11 and S12. The row decoder 21 shown in FIG. 2 is formed in the row decoder area S13. In this way, the memory cell array area S11, row decoder area S13 and memory cell array area S12 are arranged along the direction in which the word lines WL1 to WLn extend. The column selector 25, write/verify circuit 27, etc., shown in FIG. 2, are formed in a peripheral circuit area S14. The peripheral circuit area S14 is arranged adjacent to the memory cell array area S12 along the direction in which the bit lines BL1 to BLn extend. Similarly, the column selector 25, write/verify circuit 27, etc., shown in FIG. 2, are formed in a peripheral circuit area S15, which is arranged adjacent to the memory cell array S11 along the direction in which the bit lines BL1 to BLn extend. The level shifters 25A and 25B shown in FIG. 2 are formed in a level shifter area S16, which is interposed between the peripheral circuit areas S14 and S15.

With the use of the layout pattern shown in FIG. 6, the PLD shown in FIG. 2 can be formed so that the distance L1 between word lines WL1 to WLn can be reduced, as described above. Thus, a length L10 of each of memory cell array areas S11 and S12 in the direction of extension of the bit lines can be significantly decreased. In addition, a length L20 (in the direction of extension of the word lines) occupied by the memory cell array area S11, row decoder area S13, and memory cell array area S12 can be reduced by a distance corresponding to the level shifter area S16, since it is not necessary to provide the level shifter area S16 between the row decoder area S13 and the memory cell array area S11 and between the row decoder area S13 the other memory cell array area S12, unlike the conventional semiconductor device shown in FIG. 1. The level shifter area S16 may be provided only between the peripheral circuit areas S14 and S15.

As has been described above, the present invention can provide a non-volatile memory device which is made suitable for high integration by providing a level shifter at the front stage of the input of a row decoder.

What is claimed is:

1. A non-volatile semiconductor device comprising:
   address receiving means for receiving an N-bit address signal supplied externally from said semiconductor device;
   $2^N$ word lines;
   a non-volatile memory cell array having a plurality of non-volatile memory cells connected to said $2^N$ word lines;
   level shift means, having a plurality of N level shift circuits, each for receiving one bit of said N-bit address signal, each for level shifting, in a programming mode, said one received bit from a first potential level to a second potential level, said second potential level being higher than said first potential level, and each for outputting said one received bit without level shifting in a data read mode; and
   row decoding means, provided between the $2^N$ word lines and the level shift means and driven by a programming power source voltage having said second potential level in the programming mode, for receiving and decoding said N-bit address signal which has been shifted by the level shift means, for selecting one of the $2^N$ word lines, and for setting the potential of the selected word line to said second potential level.

2. The non-volatile semiconductor memory device according to claim 1, wherein said non-volatile semiconductor device is formed on a single semiconductor chip including first to third areas, the first area in which said row decoding means is formed and the second area in which said memory cell array is formed are arranged adjacent to each other on the chip in a first direction, and wherein the third area in which said level shift means is formed is arranged adjacent to said first area on the chip in a second direction.

3. The non-volatile semiconductor memory device according to claim 1, wherein said memory cell array is divided into first and second areas which are arranged on a chip adjacent to each other in a first direction, wherein a third area in which said decoding means is formed is arranged between said first and second areas, and wherein a fourth area, in which said level shift means is formed, is arranged on the chip adjacent to said third area in a second direction.

4. The non-volatile semiconductor memory device according to claim 1, wherein said decoding means comprises first and second transistors connected in series between a power supply terminal, from which said programming power source voltage is supplied in the programming mode, and a ground terminal, a load element connected between the power supply terminal and each of gates of the first and second transistors, and a plurality of transistors connected in series between each of said gates of the first and second transistors and said ground terminal, each of the transistors having the gate for receiving the address signal from the level shift means, and wherein the potential of a connection node of the first and second transistors serves as an output of said row decoding means.

5. The non-volatile semiconductor device according to claim 1, wherein each of said level shift circuits comprises:
   first and second transistors connected in series between a power supply terminal, from which said programming power source voltage is supplied in the programming mode, and a ground terminal;
   a third transistor connected between said power supply terminal and a gate of the first transistor, and having a gate connected to a connection node of the first and second transistors; and
   an inverter circuit for receiving and inverting the externally supplied N-bit address signal and for supplying the inverted signal to gates of the first and second transistors, and wherein a potential of the connection node of the first and second transistors is an output of the level shift means.

6. The non-volatile semiconductor device according to claim 5, wherein each of said level shift circuits further comprises a fourth transistor having a gate to which a voltage lower than said programming power supply voltage is supplied, and which is connected between the gate of the first transistor and an output terminal of the inverter circuit.

7. The non-volatile semiconductor device according to claim 1, wherein each of said level shift circuits comprises:

first and second transistors connected in series between a power supply terminal, from which said programming power source voltage is supplied in the programming mode, and a ground terminal;

third and fourth transistors connected in series between said power supply terminal and said ground terminal, and an inverter circuit for receiving and inverting the externally supplied N-bit address signal and for supplying the inverted signal to a gate of the second transistor, and wherein a gate of the first transistor is connected to a connection node of the third and fourth transistors, a gate of the third transistor is connected to a connection node between the first and second transistors, a gate of the fourth transistor is supplied with the externally supplied N-bit address signal and a potential of the connection node of the first and second transistors is an output of the level shift means.

* * * * *